(12) United States Patent
Liu et al.

(10) Patent No.: US 12,040,241 B2
(45) Date of Patent: Jul. 16, 2024

(54) PACKAGE STRUCTURE FOR SEMICONDUCTOR DEVICE AND PREPARATION METHOD THEREOF

(71) Applicant: XIDIAN UNIVERSITY, Xi'an (CN)

(72) Inventors: Chen Liu, Xi'an (CN); Yuming Zhang, Xi'an (CN); Hongliang Lv, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 45 days.

(21) Appl. No.: 17/423,150

(22) PCT Filed: Dec. 13, 2019

(86) PCT No.: PCT/CN2019/125014
§ 371 (c)(1),
(2) Date: Jul. 15, 2021

(87) PCT Pub. No.: WO2021/114202
PCT Pub. Date: Jun. 17, 2021

(65) Prior Publication Data
US 2022/0319940 A1   Oct. 6, 2022

(51) Int. Cl.
*H01L 23/06* (2006.01)
*C23C 8/10* (2006.01)
(Continued)

(52) U.S. Cl.
CPC ............... *H01L 23/06* (2013.01); *C23C 8/10* (2013.01); *C23C 16/345* (2013.01);
(Continued)

(58) Field of Classification Search
CPC .......... H01L 21/02255; H01L 21/0228; H01L 2224/0344; H01L 2224/2744; H01L 23/06;
(Continued)

(56) References Cited

U.S. PATENT DOCUMENTS 4,001,872 A    1/1977  Khajezadeh
5,827,755 A *  10/1998 Yonehara ............ G02F 1/13454
                                                          438/455
(Continued)

FOREIGN PATENT DOCUMENTS

CN    1382255 A    11/2002
CN  101325170 A    12/2008
(Continued)

OTHER PUBLICATIONS

Park et al. Mass-Productive Ultra-Low Temperature ALD SiO2 Process Promising for Sub-90nm Memory and Logic Devices, Digest. International Electron Devices Meeting, (2002): 229-232 (Year: 2002).*

(Continued)

*Primary Examiner* — Sonya McCall-Shepard
(74) *Attorney, Agent, or Firm* — Workman Nydegger

(57) ABSTRACT

This disclosure provides a package structure for a semiconductor device, comprising a three-layer film consisting of a first $SiO_2$ film, a $Si_3N_4$ film and a second $SiO_2$ film stacked in this order, wherein the first $SiO_2$ film is formed by a thermal oxidation process, the $Si_3N_4$ film is formed by a low pressure chemical vapor deposition process, and the second $SiO_2$ film is formed by a low temperature atomic layer deposition process. This disclosure also provides a method for preparing the package structure for a semiconductor device.

14 Claims, 4 Drawing Sheets

(51) Int. Cl.
  C23C 8/80 (2006.01)
  C23C 16/34 (2006.01)
  C23C 16/40 (2006.01)
  C23C 16/455 (2006.01)
  H01L 21/02 (2006.01)
  H01L 21/48 (2006.01)
  H01L 21/52 (2006.01)

(52) U.S. Cl.
  CPC ...... C23C 16/402 (2013.01); C23C 16/45525 (2013.01); H01L 21/02255 (2013.01); H01L 21/0228 (2013.01); H01L 21/481 (2013.01); H01L 21/52 (2013.01)

(58) Field of Classification Search
  CPC ... H01L 21/52; H01L 21/02494–02505; H01L 21/481; C23C 8/10; C23C 16/345; C23C 16/402; C23C 16/45525; C23C 8/80
  See application file for complete search history.

(56) References Cited

U.S. PATENT DOCUMENTS

| | | | |
|---|---|---|---|
| 9,502,240 B2* | 11/2016 | Liu | H01L 21/3065 |
| 2002/0149486 A1 | 10/2002 | Lee et al. | |
| 2011/0230035 A1* | 9/2011 | Zablocki | H01L 21/2007 |
| | | | 438/459 |
| 2013/0035632 A1 | 2/2013 | Yu et al. | |
| 2013/0140649 A1 | 6/2013 | Rogers et al. | |
| 2015/0214332 A1* | 7/2015 | Li | H01L 21/31055 |
| | | | 438/287 |
| 2017/0128015 A1* | 5/2017 | Rogers | A61B 5/291 |
| 2019/0137427 A1* | 5/2019 | Cascino | H05B 3/02 |

FOREIGN PATENT DOCUMENTS

| | | | |
|---|---|---|---|
| CN | 102544236 B | * | 1/2014 |
| CN | 103889458 A | | 6/2014 |
| CN | 108389893 A | | 8/2018 |
| CN | 109626319 A | | 4/2019 |

OTHER PUBLICATIONS

Winkler, Sebastian et al., Different encapsulation strategies for implanted electronics; Current Directions in Biomedical Engineering 2017; 3(2): 725-728.

U.S. Appl. No. 61/565,907, filed Dec. 1, 2011, inventor John A. Rogers.

U.S. Appl. No. 61/636.51, filed Apr. 20, 2012, inventor John A. Rogers.

International Searching Authority (ISA/CN)—International Search Report for International application No. PCT/CN2019/125014, dated Sep. 16, 2020.

International Searching Authority (ISA/CN)—Written Opinion of the International Searching Authority for International application No. PCT/CN2019/125014, dated Sep. 16, 2020.

* cited by examiner

US 12,040,241 B2

PACKAGE STRUCTURE FOR SEMICONDUCTOR DEVICE AND PREPARATION METHOD THEREOF

TECHNICAL FIELD

This disclosure provides a package structure for a semiconductor device, comprising a three-layer film consisting of a first $SiO_2$ film, a $Si_3N_4$ film and a second $SiO_2$ film stacked in this order, wherein the first $SiO_2$ film is formed by a thermal oxidation process, the $Si_3N_4$ film is formed by a low pressure chemical vapor deposition process, and the second $SiO_2$ film is formed by a low temperature atomic layer deposition process.

BACKGROUND OF THE INVENTION

A transient semiconductor device disappears in terms of physical form and device function upon external stimulus or control by relevant instruction, which distinguishes the transient semiconductor from conventional electronic devices. For example, when used in a medical device, such as a cardiac pacemaker, medical monitor or drug delivery device, an implantable transient semiconductor may degrade within a desired period of time and metabolized by human body, making it unnecessary to take out the medical device through surgery, significantly relieving pains and reducing the risk of infection for patients. When used in an environment monitoring device, a transient device may naturally degrade after its service time upon exposure to water or seawater, avoiding device recycle and environmental pollution. When used in a military device, a transient semiconductor degrades at a predefined time or upon triggering stimulus, thus avoiding information leakage.

The transient semiconductor device is susceptible to damage upon exposure to the environment such as water, seawater or biofluid, which affects the property stability and service life of the semiconductor device. Sebastian Winkler, et al., proposed to use silicone, ceramic or titanium alloy as a package structure for the implantable electronic devices in *Biomedical Engineering* 2017, 3(2), pp. 725 to 728. However, ceramics are fragile, silicones are not airtight, and it is difficult for the titanium alloys to stretch out leads from printed circuit boards.

Therefore, there exists a continuous demand for semiconductor package structures with excellent performances.

SUMMARY OF THE INVENTION

With regard to the above problems, the present disclosure provides a package structure for a semiconductor device, comprising a three-layer film consisting of a first $SiO_2$ film, a $Si_3N_4$ film and a second $SiO_2$ film stacked in this order, wherein the first $SiO_2$ film is formed by a thermal oxidation process, the $Si_3N_4$ film is formed by a low pressure chemical vapor deposition process, and the second $SiO_2$ film is formed by a low temperature atomic layer deposition process.

The present disclosure also provides a method for preparing a package structure for a semiconductor device, including:
a) growing a first $SiO_2$ film on a silicon wafer by a thermal oxidation process;
b) growing a $Si_3N_4$ film on the first $SiO_2$ film by a low pressure chemical vapor deposition process; and
c) growing a second $SiO_2$ film on the $Si_3N_4$ film by a low temperature atomic layer deposition process, thereby obtaining a three-layer film consisting of the first $SiO_2$ film, the $Si_3N_4$ film and the second $SiO_2$ film stacked in this order.

All other features, aspects and advantages of the present disclosure will be apparent taken in conjunction with the accompanying drawings. The drawings, not drawn to scale, intend to schematically illustrate various structural and positional relationships, and will nevertheless be construed as limitations.

DETAILED DESCRIPTION OF THE INVENTION

Figure 1:
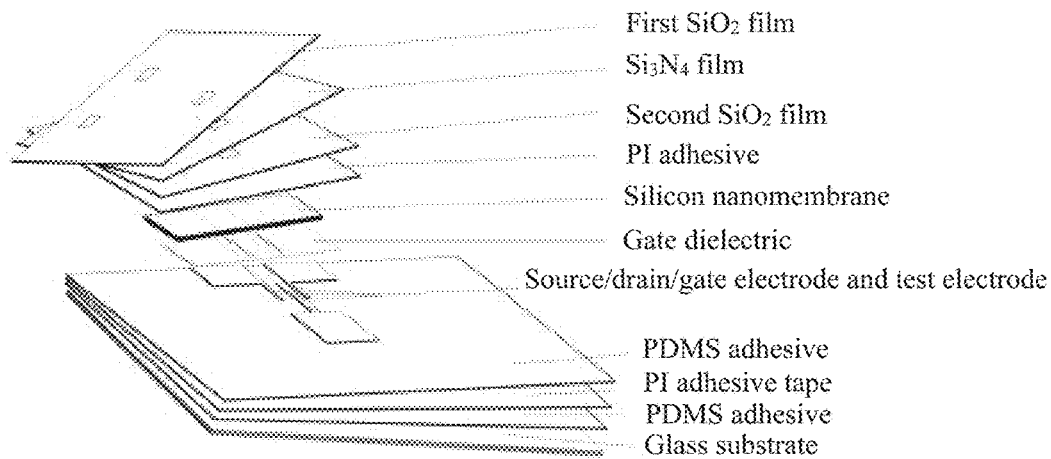
FIG. 1 shows an exploded view of the package structure for a semiconductor device according to the present disclosure.

Throughout this disclosure, all the scientific and technical terms, unless otherwise indicated, shall have the same meanings as those known to a person skilled in the art. Where there is inconsistency, the definition provided in the present disclosure should be taken.

Herein, the terms "package structure", "three-layer film", "three-layer film structure" and "three-layer film package structure" may be interchangeably used, and mean "a three-layer film structure of a first $SiO_2$ film/$Si_3N_4$ film/the second $SiO_2$ film", abbreviated to "$SiO_2$ film/$Si_3N_4$ film/$SiO_2$ film".

The terms "semiconductor device" and "semiconductor" used herein are interchangeable.

Unless otherwise specified, the numerical ranges recited in the present disclosure intend to include the end points and all numbers and sub-ranges within the respective ranges.

In the present context, all materials, contents, processes, devices, drawings and examples are presented for the purposes of illustration, and therefore, unless expressly specified otherwise, are not construed as limitations.

The terms "comprising", "including" and "having" used herein mean that other ingredients or other steps which do not affect the final effect can be included. These terms encompass the terms "consisting of" and "consisting essentially of". The product and process according to the present disclosure can comprise or include, consist of, or consist essentially of the essential technical features described in the present disclosure, as well as any additional and/or optional ingredients, components, steps, or other limitative features described herein.

When the word "about" is used to refer to a value or a numerical range, it typically represents that a derivation of ±10%, ±5%, ±1% or ±0.5% of the referred value or endpoints of the numerical range may exist.

Unless specially indicated, all materials and agents used in the present disclosure are commercially available.

Unless otherwise indicated or apparently contradicted, all operations in the present context may be carried out at room temperature and ambient pressure.

Unless otherwise indicated or apparently contradicted, the process steps of the present disclosure can be conducted in any appropriate order.

Examples of the present disclosure are described in detail as follows.

Package Structure for a Semiconductor Device

According to the present disclosure, the package structure for a semiconductor device comprises a three-layer film consisting of a first $SiO_2$ film, a $Si_3N_4$ film and a second $SiO_2$ film stacked in this order, wherein the first $SiO_2$ film is formed by a thermal oxidation process, the $Si_3N_4$ film is formed by a low pressure chemical vapor deposition process, and the second $SiO_2$ film is formed by a low temperature atomic layer deposition process. According to the present disclosure, the first $SiO_2$ film, the $Si_3N_4$ film and the second $SiO_2$ film prepared by specific methods all have flat and dense surfaces, and are free of defects, such as pinhole.

In biological body fluids such as blood, semen, saliva, sweat, urine and gastric juice; or in naturally existing water such as underground water and seawater, $SiO_2$ film grown by thermal oxidation has a hydrolysis rate or degradation rate of as low as only about 0.003 nm/day, but has an insufficient resistance to ion penetration. For example, sodium ion has a diffusion coefficient in $SiO_2$ film grown by thermal oxidation of up to about $6.53 \times 10^{-21}$ $m^2$ $s^{-1}$. $Si_3N_4$ film has very high resistance to ion penetration. For example, in a $Si_3N_4$ film prepared by low pressure chemical vapor deposition process, sodium ion has a diffusion coefficient of as low as about $4.94 \times 10^{-25}$ $m^2$ $s^{-1}$. However, the hydrolysis rate of the $Si_3N_4$ film prepared by low pressure chemical vapor deposition process is too high (about 0.158 nm/day). By employing the structure of $SiO_2$ film/$Si_3N_4$ film/$SiO_2$ film, the semiconductor package structure according to the present disclosure achieves a good resistance to ion penetration and good resistance to invasion of body fluids, i.e., hydrolysis resistance, and improves the property stability and lifespan controllability. The semiconductor package structure according to the present disclosure can either be implanted into human body for a long term, or completely degrade upon reaching the designed service time.

The first $SiO_2$ film grown in situ on a silicon wafer by a thermal oxidation process is almost defectless, may significantly reduce the hydrolysis rate and improve the resistance to ion penetration, and thus may be used as the outmost surface of the semiconductor package structure so as to come into contact with body fluid upon implantation into human body.

The $Si_3N_4$ film prepared on the first $SiO_2$ film by a low pressure chemical vapor deposition process also has low defect but high quality, making it possible to enhance the ion resistance.

The second $SiO_2$ film prepared on the $Si_3N_4$ film by a low temperature atomic layer deposition process has a uniform and controllable thickness, good conformality, low defect and high quality. The second $SiO_2$ film thus obtained directly contacts with the semiconductor device, and may protect the semiconductor device from influence of the hydrolysis and water penetration of the package structure. In addition, by employing a low temperature during the preparation of the second $SiO_2$ film, damage to the underlying $Si_3N_4$ film is avoided.

Preferably, the three-layer film structure of $SiO_2$ film/$Si_3N_4$ film/$SiO_2$ film has a total thickness of from about 300 nm to about 500 nm, preferably from about 300 nm to about 400 nm, more preferably from about 300 nm to about 350 nm, and most preferably about 300 nm. Such ultra-thin thickness contributes to provide a miniaturized and lightweight semiconductor device, and imparts the semiconductor device with excellent flexibility, stretchability and property stability, enabling the semiconductor to have a good conformality and biocompatibility with human organs and tissues.

Compared with the three-layer film structure of $SiO_2$ film/$Si_3N_4$ film/$SiO_2$ film, when a monolayer $SiO_2$ film is used as a package structure, the monolayer $SiO_2$ film has to have a thickness of at least 1 μm, so as to realize a desired service life, which greatly influences the flexibility of the implantable device and its conformality with human organs and tissues. When a monolayer $Si_3N_4$ film is used as a package structure for a semiconductor device, due to the high dissolution rate, the monolayer $Si_3N_4$ film has to have a thickness of more than 1 μm so as to realize a desired service life and low ion penetration.

In some examples, the first $SiO_2$ film and the second $SiO_2$ film have the same or different thicknesses, preferably the same thickness, and the first $SiO_2$ film and the second $SiO_2$ film each independently have a thickness of from about 10 nm to 100 nm, preferably from about 15 nm to about 70 nm, more preferably from about 20 nm to 30 nm, and most preferably about 25 nm.

In some examples, the $Si_3N_4$ film has a thickness of about 100 nm to about 480 nm, preferably about 160 nm to about 370 nm, more preferably about 240 nm to about 310 nm, and most preferably about 250 nm.

Preferably, the first $SiO_2$ film and the second $SiO_2$ film each independently have a thickness of from about 20 nm to about 30 nm, and the $Si_3N_4$ film has a thickness of from about 240 nm to 260 nm.

In some examples, the total thickness of the three-layer film is about 300 nm, wherein the first $SiO_2$ film has a thickness of about 25 nm, the $Si_3N_4$ film has a thickness of about 250 nm, and the second $SiO_2$ film has a thickness of about 25 nm. Such thickness surprisingly realizes a threshold voltage shift $\Delta V_{th}$ of no more than 0.3 V within 4000 days (approximately 11 years) in a stimulated body fluid environment.

In some examples, the semiconductor device has the package structure on one side thereof, and the semiconductor device is in contact with the second $SiO_2$ film. In other words, the semiconductor with the package structure is a multilayered combination of the first $SiO_2$ film/$Si_3N_4$ film/the second $SiO_2$ film/semiconductor device.

Optionally, an adhesive tape, such as polyimide (PI) tape, is adhered to the side of the semiconductor device opposite to the package structure. In other words, the semiconductor with the package structure is a sandwiched combination of the first $SiO_2$ film/$Si_3N_4$ film/the second $SiO_2$ film/semiconductor device/PI film. Such structure facilitates direct use in some events, for example, direct attachment to body surface, similar with a Band-aid.

In some examples, the semiconductor device has the package structure on both sides thereof, and the semiconductor device is in contact with the second $SiO_2$ film of each package structure. In other words, the semiconductor with the package structure is a multilayered combination of the first $SiO_2$ film/$Si_3N_4$ film/the second $SiO_2$ film/semiconductor device/the second $SiO_2$ film/$Si_3N_4$ film/the first $SiO_2$ film. By sandwiching the semiconductor device between the two package structures, the semiconductor device can be omni-directionally protected, the resistance to ion penetration and hydrolysis resistance of the encapsulated semiconductor device are further enhanced, and the property stability of the semiconductor device is enhanced. In particular, the semiconductor device encapsulated on both sides is suitable for in vivo implantation and exposure to external environment. The package structures on the two sides of the semiconductor may be the same or different, preferably the same.

Here, the adhesive tape and package structure serve as carrier and protection layer of the semiconductor device, and preferably are degradable.

Preferably, the semiconductor device is a transient semiconductor device.

Preferably, the semiconductor device is an implantable transient semiconductor device. The semiconductor package structure according to the present disclosure may be combined with a biodegradable electrode, interconnected metal, and/or gate insulating layer so as to form a transient semiconductor device.

Preferably, the semiconductor device is selected from field effect transistors, light emitting diodes, photovaristors, switch elements, wireless communication equipments, and any combinations thereof.

The package structure for the semiconductor device according to the present disclosure may be used in medical devices, environmental monitoring devices, or military devices. Preferably, the medical device is a cardiac pacemaker, cardioverter defibrillator, medical monitor, or drug delivery device.

Method for Preparing the Package Structure for a Semiconductor Device

The method for preparing the package structure for a semiconductor device according to the present disclosure includes:
- a) growing a first $SiO_2$ film on a silicon wafer by a thermal oxidation process;
- b) growing a $Si_3N_4$ film on the first $SiO_2$ film by a low pressure chemical vapor deposition process; and
- c) growing a second $SiO_2$ film on the $Si_3N_4$ film by a low temperature atomic layer deposition process,
- thereby obtaining a three-layer film consisting of the first $SiO_2$ film, the $Si_3N_4$ film and the second $SiO_2$ film stacked in this order.

In some examples, the method for preparing the package structure for a semiconductor device according to the present application includes:
- a) growing a first $SiO_2$ film on a silicon wafer by a thermal oxidation process at a temperature of from about 1100° C. to about 1200° C., preferably about 1150° C.;
- b) growing a $Si_3N_4$ film on the first $SiO_2$ film by a low pressure chemical vapor deposition process at a temperature of from about 750° C. to about 850° C. and at a pressure of less than 200 MPa; and
- c) growing a second $SiO_2$ film on the $Si_3N_4$ film by a low temperature atomic layer deposition process at a temperature of about 70° C. to about 90° C., preferably about 80° C.,
- thereby obtaining a three-layer film consisting of the first $SiO_2$ film, the $Si_3N_4$ film and the second $SiO_2$ film stacked in this order.

In some examples, the method according to the present application further includes:
- d) preparing a silicon nanomembrane;
- e) transfer printing the silicon nanomembrane onto the surface of the second $SiO_2$ film of the three-layer film; and
- f) preparing a semiconductor device on the silicon nanomembrane; and optionally,
- g) removing the silicon wafer, thereby obtaining a semiconductor device having a package structure on one side thereof.

Conventionally, a semiconductor device is prepared at first, and an encapsulating film is subsequently grown onto the semiconductor device at a high temperature. However, the high temperature damages the semiconductor device. In contrast to the step order of the conventional technology, an encapsulating layer is firstly prepared, and then a semiconductor device is fabricated thereon according to the present disclosure. The advantage of the method according to the present application is that the prepared package film structure is dense and uniform, and is not subject to temperature restriction. In addition, the package technology highly matches with the semiconductor fabrication process.

In some examples, the method according to the present application further includes:
- h) on the side of the semiconductor device opposite to the package structure, laminating an additional package structure prepared according to the method of the present disclosure, so as to bring the semiconductor device into contact with the second $SiO_2$ film of the additional package structure, thereby obtaining a semiconductor device having the package structure on both sides thereof.

Step a), step b) and/or step c) may be carried out simultaneously or successively with step d).

Preferably, step d) includes:
- d1) coating a photoresist onto the top silicon layer of a silicon-on-insulator (SOI), performing an ion implantation by using the photoresist as a mask so as to form active regions of the semiconductor device on the top silicon layer, and removing the photoresist;
- d2) additionally coating a photoresist onto the top silicon layer of the active regions, performing reactive ion etching by using the additionally-coated photoresist as a mask so as to form etched holes on the top silicon layer and expose the silicon dioxide of the SOI at the bottom of the etched holes, and removing the additionally-coated photoresist; and
- d3) performing wet etching by using hydrofluoric acid so as to remove the silicon dioxide layer of the SOI until the top silicon layer having the active regions and etched holes falls down and gets registered onto the bottom silicon substrate by van der Waals force. The top silicon layer thus obtained is a silicon nanomembrane.

Preferably, step e) includes:
- e1) picking up the silicon nanomembrane by a flexible stamp; and
- e2) transfer printing the picked-up silicon nanomembrane to the surface of the second $SiO_2$ film of the three-layer film package structure.

The flexible stamp is preferably made of polydimethyl siloxane (PDMS).

Preferably, a polyimide (PI) adhesive is spin-coated onto the second $SiO_2$ film, the silicon nanomembrane is transfer printed onto the second $SiO_2$ film with the PI adhesive, and the whole structure is placed into, for example, a nitrogen oven so as to heat and cure the PI adhesive. There is no specific limitation on the PI adhesive, and any PI adhesive useful in the semiconductor field is suitable here, for example, PI-2545.

In step f), a semiconductor device is prepared onto the silicon nanomembrane by using a conventional method. For example, a semiconductor device is fabricated through a standard CMOS process, such as lithography, mesa isolation, dielectric growth, wet etching, metal deposition, etc. The fabricated semiconductor device includes, for example, the source electrode, the drain electrode, the gate electrode, the gate dielectric, and other optional elements.

In the case of fabricating a semiconductor device having a package structure on one side thereof, preferably, the method further includes the following steps after step f):

f-1) bonding the semiconductor device with a glass substrate with an adhesive tape;

g) removing the silicon wafer;

g-1) etching the three-film package structure so as to expose the test electrodes (pad) in the semiconductor device; and g-2) removing the glass substrate so as to obtain a sandwiched structure having the second $SiO_2$ film, the $Si_3N_4$ film and the first $SiO_2$ film stacked in this order on one side of the semiconductor device, and having an adhesive tape on the other side of the semiconductor device.

In some examples, the resultant final semiconductor device having a package structure on one side thereof may be a combination of the semiconductor device/the three-layer film package structure, or a sandwiched structure of the adhesive tape/semiconductor device/three-layer film package structure.

In the case of fabricating a semiconductor device having the package structure on both sides thereof, preferably, the method further includes the following steps after step f):

h) preferably, on the side of the semiconductor device opposite to the package structure, laminating an additional package structure according to the present application so as to bring the semiconductor device into contact with the second $SiO_2$ film of the additional package structure;

h-1) removing the silicon wafer in one or both of the package structures; and h-2) etching one or both of the three-film package structures so as to expose the test electrodes (pad) in the semiconductor device, thereby obtaining the semiconductor device having package structures on both sides thereof.

In some examples, the resultant final semiconductor device having the package structure on both sides thereof may be a sandwiched structure of the three-layer film package structure/semiconductor device/three-layer film package structure.

In some examples, in step f-1), the surface of the semiconductor is optionally cleaned, a PI adhesive (such as PI-2545) is spin-coated onto the surface of the semiconductor device, and for example heated and cured in a nitrogen oven to cure the PI adhesive. Subsequently, a PDMS adhesive is spin-coated on the surface of the cured PI adhesive so as to firmly bond the PDMS adhesive with the PI adhesive, and is for example heated and cured in a vacuum oven.

A PDMS adhesive is spin-coated onto the glass substrate, and cured for example in a vacuum oven. Subsequently, the semiconductor device is bonded with the glass substrate with a PI adhesive tape so as to form a structure of the glass substrate/PDMS adhesive/PI adhesive tape/PDMS adhesive/PI adhesive/semiconductor device laminated in this order. The PI adhesive tape and the PDMS adhesive may be used alone or in any combination thereof according to requirements.

In some examples, in step g) or h-1), the backside of the silicon wafer is cleaned by using a buffered oxide etch (BOE) solution, and acetone, isopropanol and deionized water. Here, the buffered oxide etch (BOE) is a mixture of aqueous HF solution and aqueous $NH_4F$ solution, wherein 49% of aqueous HF solution is used as the main etchant, and aqueous $NH_4F$ solution is used as the buffering agent. Subsequently, the cleaned silicon wafer is completely removed by using the STS deep silicon etching technology, and the package structure consisting of the first $SiO_2$ film, the $Si_3N_4$ film and the second $SiO_2$ film laminated in this order is exposed.

Preferably, in step g-1) or h-2), the package structure consisting of the first $SiO_2$ film, the $Si_3N_4$ film and the second $SiO_2$ film laminated in this order is etched so as to expose a part of the semiconductor device, for example, expose the test electrodes of the semiconductor device. Here, inductively coupled plasma-reactive ion etching (ICP-RIE) is preferably combined with wet etching. For example, two wet etching methods, which employ a BOE solution and $Si(OH)_4/NH_4F/H_3PO_4$ mixed solution respectively, may be used in combination.

EXAMPLES

Example 1

Fabrication of a Flexible and Transient MOSFET Having a Package Structure on One Side Thereof Firstly, a 2-inch silicon wafer was cleaned. Then the following steps were conducted:

step a): growing a first $SiO_2$ film (thickness: 25 nm) on the silicon wafer by a thermal oxidation process at about 1150° C.;

step b): growing a $Si_3N_4$ film (thickness: 250 nm) on the first $SiO_2$ film by a low pressure chemical vapor deposition process at a temperature of about 800° C. and a pressure of about 180 MPa; and step c): growing a second $SiO_2$ film (thickness: 25 nm) on the $Si_3N_4$ film by a low temperature atomic layer deposition process at about 80° C., thereby obtaining a three-layer film consisting of the first $SiO_2$ film, the $Si_3N_4$ film and the second $SiO_2$ film stacked in this order.

Figure 3:
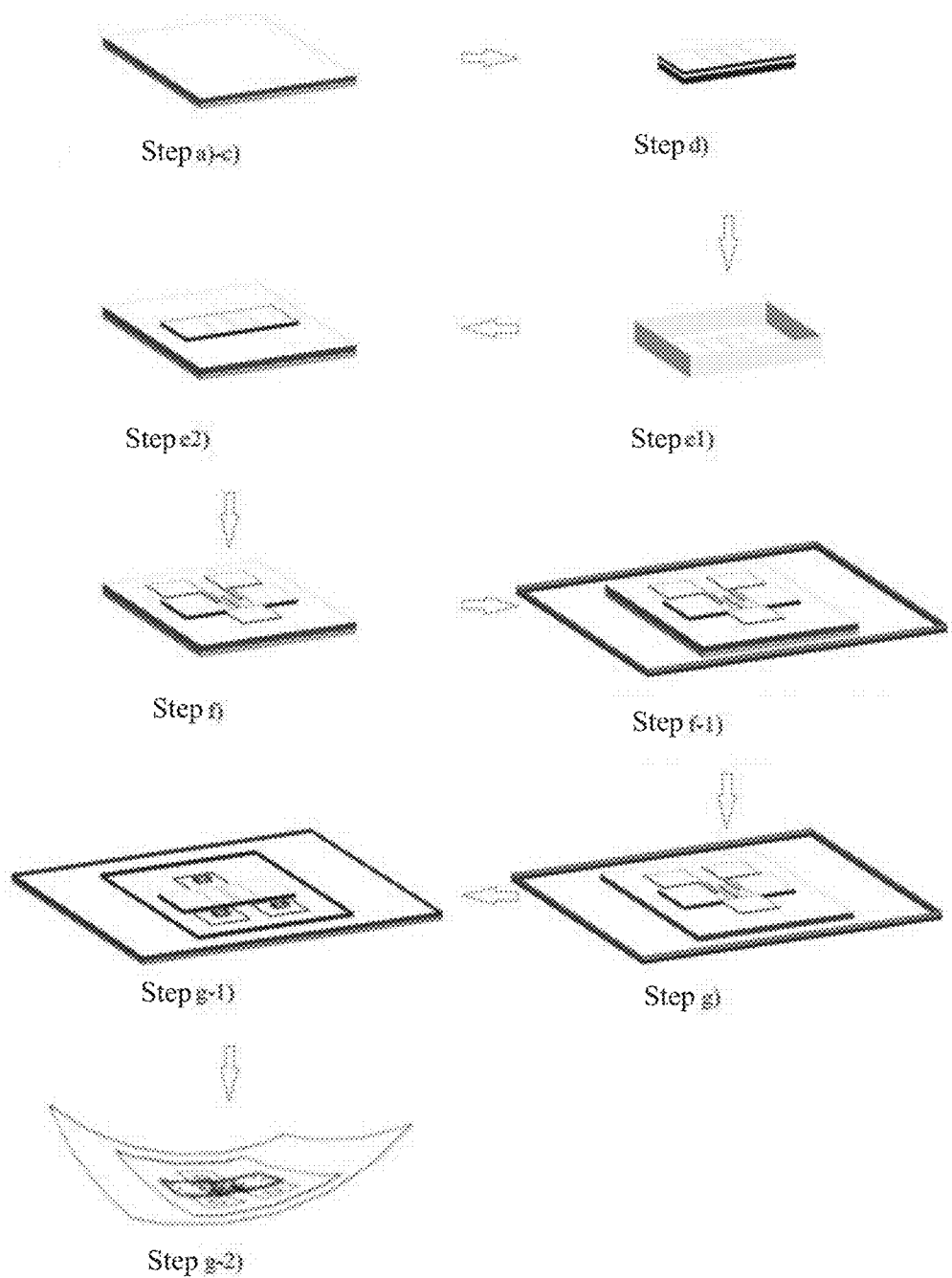
FIG. 3 shows a flow chart of preparing the package structure for a semiconductor device according to the present disclosure.

In the steps a) to c) of FIG. 3, the materials were a silicon wafer, the first $SiO_2$ film/$Si_3N_4$ film/the second $SiO_2$ film from bottom up to the top.

Step d): preparing a silicon nanomembrane.

A SOI (silicon on insulator) epitaxial wafer of 2 cm*2 cm was cleaned. The SOI had a structure of Si—$SiO_2$—Si, with the thickness of each layer being 200 nm (also referred to as top silicon layer), 150 nm, and 675 μm (also referred to as bottom silicon layer).

A photoresist was spin-coated onto the top silicon layer of the SOI epitaxial wafer, an ion implantation was performed by using the photoresist as a mask so as to form active regions of the semiconductor device on the top silicon layer, and the photoresist was removed.

After the removal of the photoresist, a photoresist was additionally spin-coated onto the top silicon layer of the active regions, a reactive ion etching was performed by using the additionally-coated photoresist as a mask so as to form etched holes on the top silicon layer, and expose the silicon dioxide of the SOI at the bottom of the etched holes, and the additionally-coated photoresist was removed.

After the further removal of the photoresist, wet etching was performed by using hydrofluoric acid so as to remove the silicon dioxide layer of the SOI until the top silicon layer having the active regions and etched holes falls down and gets registered onto the bottom silicon substrate by van der Waals force. The top silicon layer thus obtained was a silicon nanomembrane.

In step d) of FIG. 3, the materials were a silicon substrate and a ("suspending", i.e., falling down and registered) silicon nanomembrane from bottom up to the top.

Step e): transfer printing the silicon nanomembrane onto the surface of the second $SiO_2$ film of the three-layer film.

Specifically, step e) included the following steps:

e1) picking up the silicon nanomembrane by a flexible stamp.

The smooth side of the polydimethyl siloxane (PDMS) was brought into contact with the 200 nm top silicon nanomembrane, and peeled up rapidly. The top silicon nanomembrane was thus separated from the bottom silicon and remained on the flexible stamp.

In step e1) of FIG. 3, the materials were the silicon nanomembrane and the PDMS flexible stamp from bottom up to the top.

e2) transferring the picked-up silicon nanomembrane to the surface of the second $SiO_2$ film of the three-layer film package structure.

A polyimide (PI) adhesive was spin-coated onto the surface of the second $SiO_2$ film in the three-layer package structure consisting of the first $SiO_2$ film, the $Si_3N_4$ film and the second $SiO_2$ film. The 200 nm silicon nanomembrane, which has been transfer printed onto the PDMS flexible stamp, was transferred to the second $SiO_2$ film having the PI adhesive. Then, the PI adhesive was cured in a nitrogen oven.

In step e2) of FIG. 3, the materials were the silicon wafer, the first $SiO_2$ film/$Si_3N_4$ film/the second $SiO_2$ film, the PI adhesive, and the silicon nanomembrane from bottom up to the top.

Step f): fabricating a semiconductor device on the silicon nanomembrane.

A MOSFET device was fabricated through standard CMOS processes, such as lithography, mesa isolation, dielectric growth, wet etching, metal deposition, etc. The MOSFET device includes the following parts: symmetrically doped source region and drain region, a channel region, the gate dielectric, the electrode at the gate end and the test electrode, the electrodes at the source-drain ends and the test electrodes.

In step f) of FIG. 3, the materials were the silicon wafer, the first $SiO_2$ film/$Si_3N_4$ film/the second $SiO_2$ film, the PI adhesive, the silicon nanomembrane, the gate dielectric, the electrodes at the source/drain/gate ends, and the test electrode from bottom up to the top.

f-1) bonding the semiconductor device with a glass substrate with an adhesive tape.

A PI adhesive was spin-coated onto the surface of the MOSFET surface, heated and cured in a nitrogen oven. Subsequently, a PDMS adhesive was spin-coated onto the surface of the cured PI adhesive, heated and cured in a nitrogen oven.

A PDMS adhesive was spin-coated on the glass substrate, heated and cured in a vacuum oven.

Subsequently, the MOSFET device was bonded with the glass substrate with a PI adhesive tape.

In step f-1) of FIG. 3, the materials were the silicon wafer, the first $SiO_2$ film/$Si_3N_4$ film/the second $SiO_2$ film, the PI adhesive, the silicon nanomembrane, the gate dielectric, the electrodes at the source/drain/gate ends and the test electrodes, PI adhesive, PDMS adhesive, PI adhesive tape, PDMS adhesive, and glass substrate from bottom up to the top.

Step g): removing the silicon wafer.

The backside of the silicon wafer was cleaned by using a buffered oxide etch (BOE) solution, and acetone, isopropanol and deionized water. Here, the buffered oxide etch (BOE) solution was a mixture of aqueous HF solution and aqueous $NH_4F$ solution, wherein 49% of aqueous HF solution was used as the main etchant, and aqueous $NH_4F$ solution was used as the buffering agent. Subsequently, the cleaned silicon wafer was completely removed by using the STS deep silicon etching technology, and the package structure consisting of the first $SiO_2$ film, the $Si_3N_4$ film and the second $SiO_2$ film laminated in this order was exposed.

Figure 2:
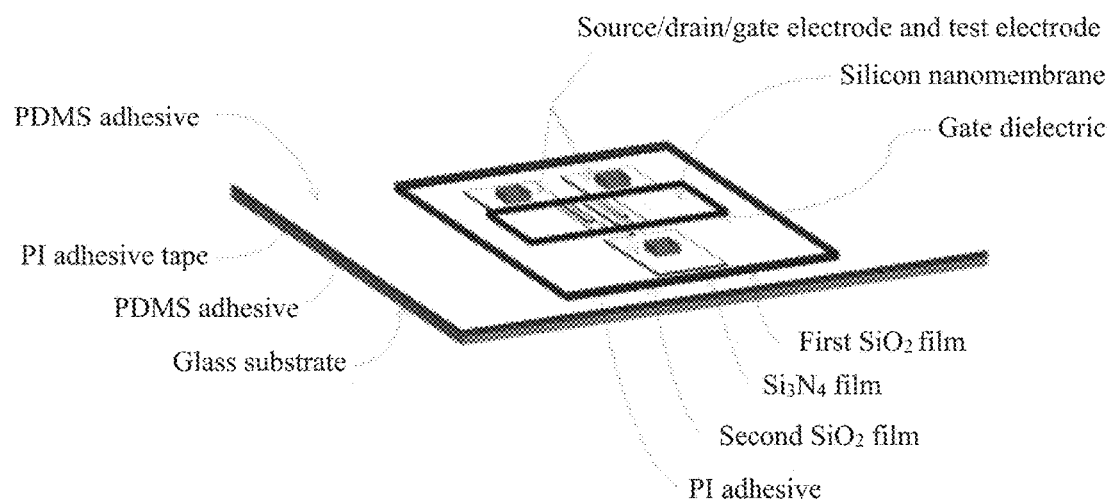
FIG. 2 shows a perspective view of the package structure for a semiconductor device according to the present disclosure.

In step g) of FIG. 3, the materials were the first $SiO_2$ film/$Si_3N_4$ film/the second $SiO_2$ film, the PI adhesive, the silicon nanomembrane, the gate dielectric, the electrodes at the source/drain/gate ends and the test electrodes, PI adhesive (not shown in FIG. 1 and FIG. 2), PDMS adhesive, PI adhesive tape, PDMS adhesive, and glass substrate from bottom up to the top, as shown in FIG. 1 and FIG. 2.

Step g-1): etching the three-film package structure so as to expose the test electrodes.

The semiconductor device obtained from step g) was flipped over. Lithography was carried out on the surface of the first $SiO_2$ film of the three-layer film package structure, preferably by combining inductively coupled plasma-reactive ion etching (ICP-RIE) and wet etching, so as to etch the three-layer film package structure covered on the test electrode and expose the test electrode. A flexible MOSFET having a three-layer film package structure was thus obtained. Here, two wet etching methods, which employed a BOE solution and $Si(OH)_4/NH_4F/H_3PO_4$ mixed solution respectively, were used in combination.

In step g-1) of FIG. 3, the materials were glass substrate, PDMS adhesive, PI adhesive tape, PDMS adhesive, PI adhesive (not shown in FIG. 1 and FIG. 2), the electrodes at the source/drain/gate ends and the test electrodes, the gate dielectric, the silicon nanomembrane, the PI adhesive, and the second $SiO_2$ film/$Si_3N_4$ film/the first $SiO_2$ film from bottom up to the top, as shown in FIG. 1 and FIG. 2.

Step g-2): removing the glass substrate so as to obtain a sandwiched structure having the second $SiO_2$ film, the $Si_3N_4$ film and the first $SiO_2$ film stacked in this order on one side of the semiconductor device, and having an adhesive tape on the other side of the semiconductor device.

The PI adhesive tape carrying the fabricated flexible MOSFET device as a whole was peeled from the glass substrate, so as to obtain a sandwiched structure of PI adhesive tape/semiconductor device/three-layer film package structure as a flexible and transient MOSFET device.

In step g-2) of FIG. 3, the materials were PI adhesive tape, PDMS adhesive, PI adhesive, the electrodes at the source/drain/gate ends and the test electrodes, the gate dielectric, the silicon nanomembrane, the PI adhesive, and the second $SiO_2$ film/$Si_3N_4$ film/the first $SiO_2$ film from bottom up to the top.

Example 2

A Three-Layer Film Package Structure for a Flexible Electrode

The preparation method in Example 2 was the same as that in Example 1, except that the MOSFET device was replaced by a flexible electrode of metal material. The ultra-thin package structure thus prepared was suitable for producing an electrode for epilepsy treatment with high temporal and spatial resolution as well as long shelf life, which significantly improved its service life and property stability in physiological environment rich in a large amount of ions and biological medium.

Example 3

Simulation Study of the Performances of a Flexible and Transient MOSFET Device with a Package Structure on One Side Thereof The flexible and transient MOSFETs with the package structures on one sides thereof were prepared in the same manner as that in Example 1, except changing the thicknesses and layer numbers of the films in the package structures. The performances of these flexible and transient MOSFETs with package structures were individually simulated.

As described above, it is known that in body fluid environment of 37° C., $SiO_2$ film grown by thermal oxidation and $Si_3N_4$ film prepared by low pressure chemical vapor deposition process have a hydrolysis rate of about 0.003 nm/day and about 0.158 nm/day, respectively. $Na^+$ has a diffusion coefficient in $SiO_2$ film grown by thermal oxidation and $Si_3N_4$ film prepared by low pressure chemical vapor deposition process of $6.53 \times 10^{-21}$ $m^2$ $s^{-1}$ and $4.94 \times 10^{-25}$ $m^2$ $s^{-1}$, respectively. $Na^+$ has a saturated concentration in the first $SiO_2$ film grown by thermal oxidation of 33 mmol/L. The threshold voltage stability (as shown in FIG. 4 and FIG. 6) and ion penetration over time (as shown in FIG. 5) of the flexible and transient MOSFETs with package structures on one side thereof were simulated by using a COMSOL Multiphysics simulation software and by solving the poisson's equation and the continuity equation of ion transportation.

Figure 4:
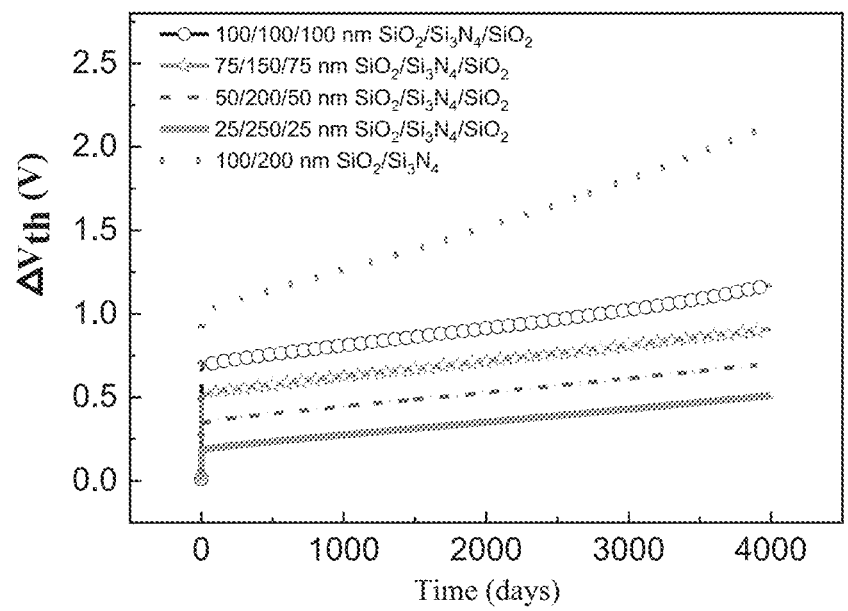
FIG. 4 compares the threshold voltage stability curves of the encapsulated semiconductors prepared according to the Examples of the present disclosure with that of an encapsulated semiconductor as a control.

FIG. 4 compared the threshold voltage stability curves of the encapsulated flexible and transient MOSFETs prepared according to Example 1 and that as a control. The flexible and transient MOSFET device having a 25 nm $SiO_2$ film/250 nm $Si_3N_4$ film/25 nm $SiO_2$ film as a package structure in Example 1 surprisingly exhibited the best stability, with the threshold voltage shift $\Delta V_{th}$ being no more than 0.3 V within 4000 days (approximately 11 years). With the total thickness (300 nm) of the package structure being kept constant, when the thicknesses of the first $SiO_2$ film and the second $SiO_2$ film simultaneously increased from 25 nm to 100 nm, the $\Delta V_{th}$ gradually increased, and the stability gradually decreased. In particular, when a dual-layer package structure of 100 nm $SiO_2$ film/200 nm $Si_3N_4$ film replaced for the three-layer package structure of $SiO_2$ film/$Si_3N_4$ film/$SiO_2$ film, the stability was the worst.

Figure 5:
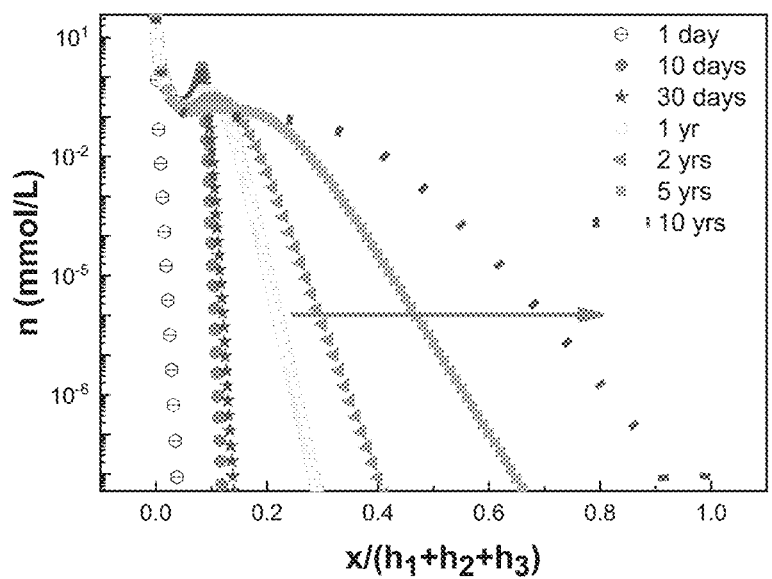
FIG. 5 shows curves of stability of the package structure for a semiconductor device over time according to the Examples of the present disclosure.

FIG. 5 showed the curves of stability over time of the encapsulated flexible and transient MOSFET device prepared according to Example 1. The vertical coordinate n represents the concentration of the sodium ions of body fluid at the simulation point of the package structure. In the horizontal coordinate, x represents the depth of the simulation point of the package structure away from the first $SiO_2$ film of the package structure/body fluid interface, $(h_1+h_2+h_3)$ represents the total thickness of the package structure, $x/(h_1+h_2+h_3)$ represents the ratio of the depth of the simulation point to the total thickness of the package structure, $x/(h_1+h_2+h_3)$ being 0 represents that the simulation point is located at the interface of the first $SiO_2$ film of the package structure/body fluid, and $x/(h_1+h_2+h_3)$ being 1 represents that the simulation point is located at the second $SiO_2$ film of the package structure (adjacent to the semiconductor device). It can be seen that after 10 years, only an extremely small amount of sodium ions (less than $10^{-9}$ mmol/L) could completely penetrate through the package structure and arrive at the surface of the semiconductor device. In other words, the package structure had a very good resistance to ion penetration.

Figure 6:
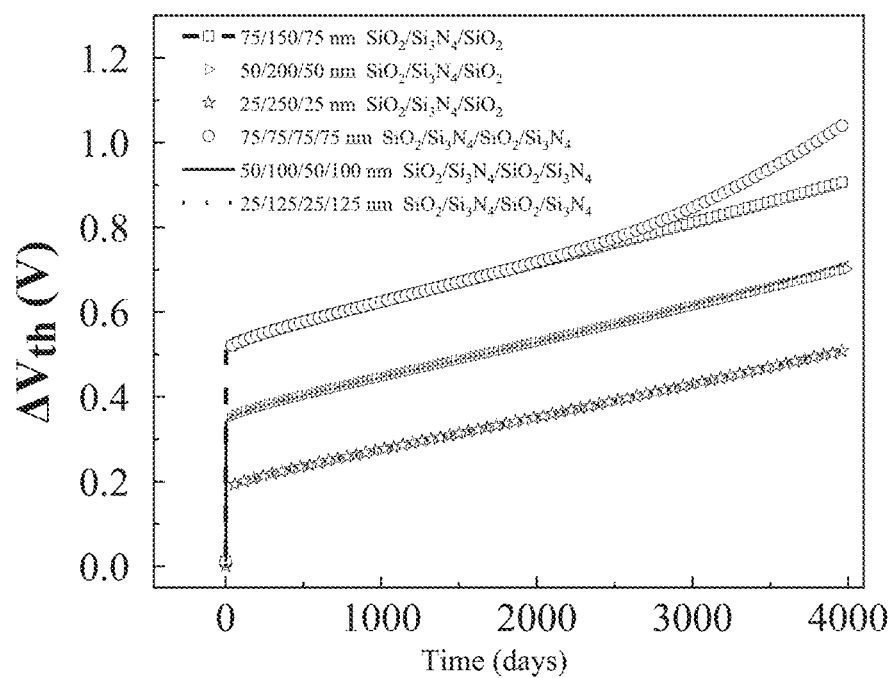
FIG. 6 compares the threshold voltage stability curves of the encapsulated semiconductors prepared according to the Examples of the present disclosure with that of an encapsulated semiconductor as a control.

FIG. 6 compared the threshold voltage stability curves of the encapsulated flexible and transient MOSFET device prepared according to Example 1 with that as a control. Similar with FIG. 4, the total thickness (300 nm) of the package structure was kept constant. The thicknesses of the first $SiO_2$ film and the second $SiO_2$ film were also the same as those in FIG. 4, i.e., being 25 nm, 50 nm and 75 nm, respectively. The difference between FIG. 6 and FIG. 4 lies in that the $Si_3N_4$ film was split into two $Si_3N_4$ films. By comparison, the flexible MOSFET device encapsulated by the three-layer film had a better long-term stability than the flexible MOSFET device encapsulated by the four-layer film. With the decrease of the total thickness of the $Si_3N_4$ film in the package structure from 250 nm to 150 nm, the threshold voltage shift $\Delta V_{th}$ of the flexible MOSFET device encapsulated by the four-layer film deteriorated more significantly and its stability became worse, compared with the flexible MOSFET device encapsulated by the three-layer film.

What is claimed is:

1. A package structure for a semiconductor device, comprising:
    a three-layer film consisting of a first $SiO_2$ film, a $Si_3N_4$ film and a second $SiO_2$ film stacked in this order,
    wherein the first $SiO_2$ film is formed by a thermal oxidation process, the $Si_3N_4$ film is formed by a low pressure chemical vapor deposition process, and the second $SiO_2$ film is formed by a low temperature atomic layer deposition process, and
    wherein the three-layer film has a total thickness of from about 300 nm to about 500 nm.

2. The package structure for a semiconductor device according to claim 1, wherein the first $SiO_2$ film and the second $SiO_2$ film have the same or different thicknesses, and the first $SiO_2$ film and the second $SiO_2$ film each independently have a thickness of from about 10 nm to 100 nm.

3. The package structure for a semiconductor device according to claim 1, wherein a total thickness of the three-layer film is about 300 nm, the first $SiO_2$ film has a thickness of about 25 nm, the $Si_3N_4$ film has a film of about 250 nm, and the second $SiO_2$ film has a thickness of about 25 nm.

4. The package structure for a semiconductor device according to claim 1, wherein the semiconductor device has the package structure on one side thereof, and the semiconductor device is in contact with the second $SiO_2$ film.

5. The package structure for a semiconductor device according to a claim 1, wherein the semiconductor device has the package structure on both sides thereof, and the semiconductor device is in contact with the second $SiO_2$ film.

6. A method for preparing a package structure for a semiconductor device, including:
    growing a first $SiO_2$ film on a silicon wafer by a thermal oxidation process;
    growing a $Si_3N_4$ film on the first $SiO_2$ film by a low pressure chemical vapor deposition process; and growing a second SiO$_2$ film on the Si$_3$N$_4$ film by a low temperature atomic layer deposition process, thereby obtaining a three-layer film consisting of the first SiO$_2$ film, the Si$_3$N$_4$ film and the second SiO$_2$ film stacked in this order, and wherein the three-layer film has a total thickness of from about 300 nm to about 500 nm.

7. The method according to claim 6, wherein:

growing the first SiO$_2$ film on the silicon wafer by the thermal oxidation process occurs at a temperature of from about 1100° C. to about 1200° C.;

growing the Si$_3$N$_4$ film on the first SiO$_2$ film by the low pressure chemical vapor deposition process occurs at a temperature of from about 750° C. to about 850° C. and at a pressure of less than 200 MPa; and growing the second SiO$_2$ film on the Si$_3$N$_4$ film by the low temperature atomic layer deposition process occurs at a temperature of about 70° C. to about 90° C.

8. The method according to claim 7, further including:

preparing a silicon nanomembrane;

transfer printing the silicon nanomembrane onto a surface of the second SiO$_2$ film of the three-layer film; and fabricating a semiconductor device on the silicon nanomembrane; and optionally, removing the silicon wafer, thereby obtaining a semiconductor device having a package structure on one side thereof.

9. The method according to claim 6, further including:

preparing a silicon nanomembrane;

transfer printing the silicon nanomembrane onto a surface of the second SiO$_2$ film of the three-layer film; and fabricating a semiconductor device on the silicon nanomembrane; and optionally, removing the silicon wafer, thereby obtaining a semiconductor device having a package structure on one side thereof.

10. The method according to claim 9, further including:

on the side of the semiconductor device opposite to the package structure, laminating an additional package structure, wherein:

preparation of the additional package structure comprises:

growing a third SiO$_2$ film on a silicon wafer by a thermal oxidation process;

growing a second Si$_3$N$_4$ film on the third SiO$_2$ film by a low pressure chemical vapor deposition process; and growing a fourth SiO$_2$ film on the second Si$_3$N$_4$ film by a low temperature atomic layer deposition process, thereby obtaining a second three-layer film consisting of the third SiO$_2$ film, the second Si$_3$N$_4$ film and the fourth SiO$_2$ film stacked in this order, and laminating the additional package structure brings the semiconductor device into contact with the fourth SiO$_2$ film of the additional package structure, thereby obtaining a semiconductor device having the package structure on both sides thereof.

11. The method according to claim 6, wherein the first SiO$_2$ film and the second SiO$_2$ film have the same or different thicknesses, and the first SiO$_2$ film and the second SiO$_2$ film each independently have a thickness of from about 10 nm to 100 nm.

12. The method according to claim 6, wherein a total thickness of the three-layer film is about 300 nm, the first SiO$_2$ film has a thickness of about 25 nm, the Si$_3$N$_4$ film has a film of about 250 nm, and the second SiO$_2$ film has a thickness of about 25 nm.

13. The method according to claim 6, wherein the semiconductor device has the package structure on one side thereof, and the semiconductor device is in contact with the second SiO$_2$ film.

14. The method according to a claim 6, wherein the semiconductor device has the package structure on both sides thereof, and the semiconductor device is in contact with the second SiO$_2$ film.

* * * * *